US010192956B2

(12) United States Patent
Chan et al.

(10) Patent No.: US 10,192,956 B2
(45) Date of Patent: Jan. 29, 2019

(54) METHOD FOR PRODUCING FIN STRUCTURES OF A SEMICONDUCTOR DEVICE IN A SUBSTRATE

(71) Applicant: IMEC VZW, Leuven (BE)

(72) Inventors: Boon Teik Chan, Leuven (BE); Safak Sayan, Tervuren (BE); Min-Soo Kim, Leuven (BE); Doni Parnell, Leuven (BE); Roel Gronheid, St. Agatha Rode (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/204,853

(22) Filed: Jul. 7, 2016

(65) Prior Publication Data

US 2016/0322461 A1 Nov. 3, 2016

Related U.S. Application Data

(62) Division of application No. 14/628,608, filed on Feb. 23, 2015, now Pat. No. 9,391,141.

(30) Foreign Application Priority Data

Feb. 24, 2014 (EP) .................................. 14156358

(51) Int. Cl.
*H01L 29/10* (2006.01)
*H01L 29/78* (2006.01)
*H01L 29/06* (2006.01)
*H01L 21/762* (2006.01)
*H01L 21/027* (2006.01)
(Continued)

(52) U.S. Cl.
CPC ...... *H01L 29/1037* (2013.01); *H01L 21/0273* (2013.01); *H01L 21/3065* (2013.01); *H01L 21/3081* (2013.01); *H01L 21/3085* (2013.01); *H01L 21/3086* (2013.01); *H01L 21/3088* (2013.01); *H01L 21/31116* (2013.01); *H01L 21/31122* (2013.01); *H01L 21/31138* (2013.01); *H01L 21/76224* (2013.01); *H01L 29/0649* (2013.01); *H01L 29/0653* (2013.01); *H01L 29/66795* (2013.01); *H01L 29/7851* (2013.01)

(58) Field of Classification Search
None
See application file for complete search history.

(56) References Cited

U.S. PATENT DOCUMENTS

2012/0313170 A1 12/2012 Chang et al.
2013/0175659 A1* 7/2013 Liu .................. H01L 29/66795
257/506

(Continued)

*Primary Examiner* — Alexander G Ghyka
(74) *Attorney, Agent, or Firm* — McDonnell Boehnen Hulbert & Berghoff LLP

(57) ABSTRACT

A method for producing fin structures, using Directed Self Assembly (DSA) lithographic patterning, in an area of a semiconductor substrate includes providing a semiconductor substrate covered with a shallow trench isolation (STI) layer stack on a side thereof; defining a fin area on that side of the substrate by performing a lithographic patterning step other than DSA, wherein the fin structures will be produced in the fin area; and producing the fin structures in the semiconductor substrate within the fin area according to a predetermined fin pattern using DSA lithographic patterning. The disclosure also relates to associated semiconductor structures.

10 Claims, 12 Drawing Sheets

(51) Int. Cl.
*H01L 21/308* (2006.01)
*H01L 21/311* (2006.01)
*H01L 21/3065* (2006.01)
*H01L 29/66* (2006.01)

(56) References Cited

U.S. PATENT DOCUMENTS

2013/0228866 A1* 9/2013 Lee .................. H01L 21/823431
257/355
2013/0270620 A1* 10/2013 Hu .................... H01L 21/76229
257/296
2013/0328162 A1* 12/2013 Hu ...................... H01L 27/0629
257/526

* cited by examiner

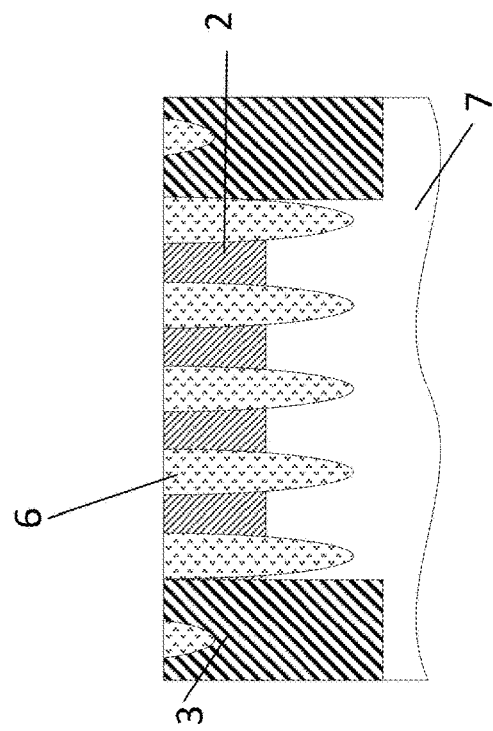
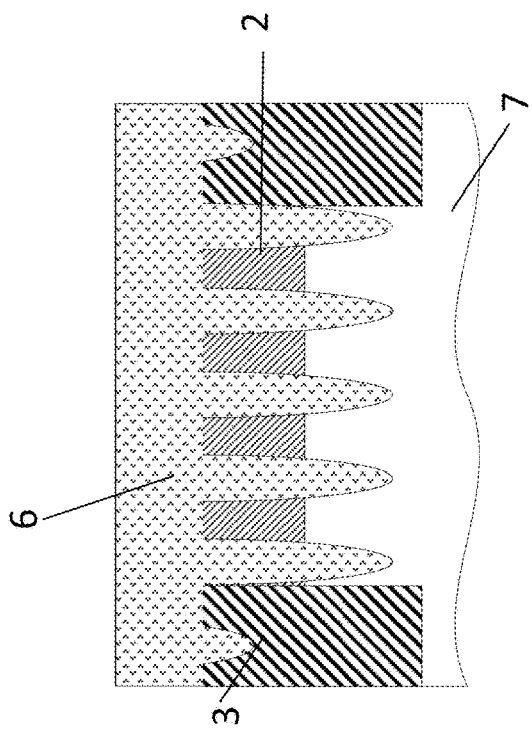

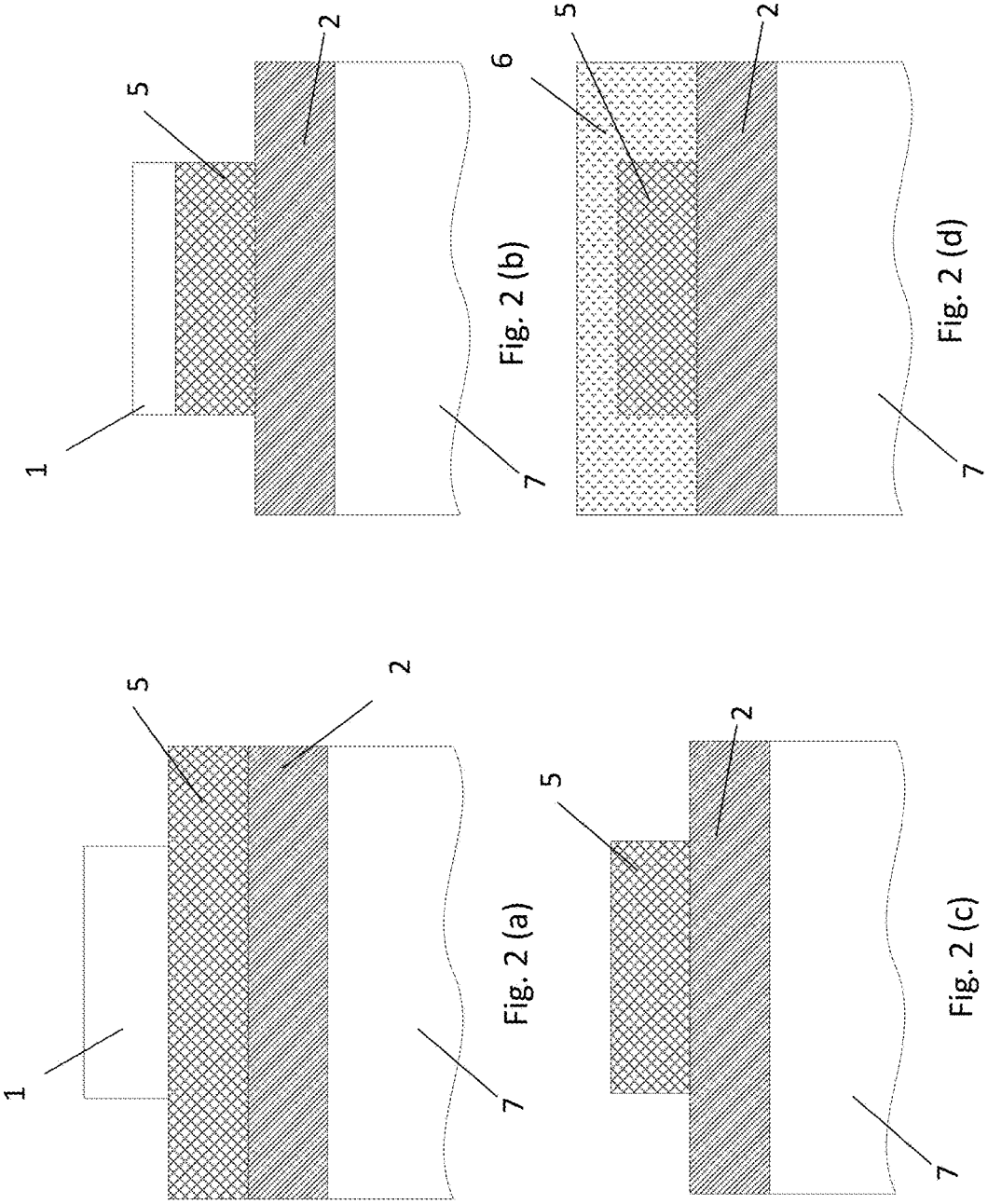

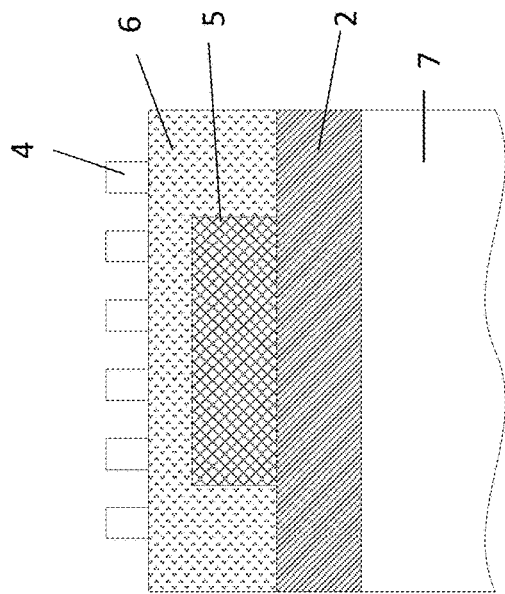
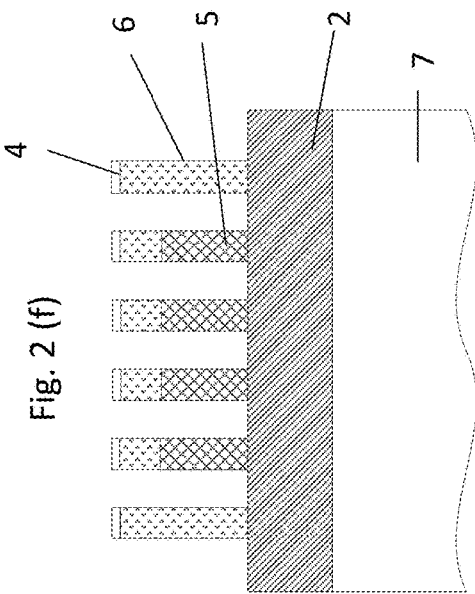
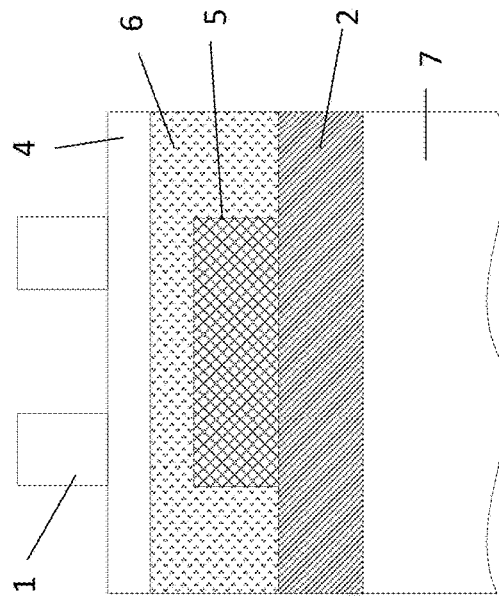

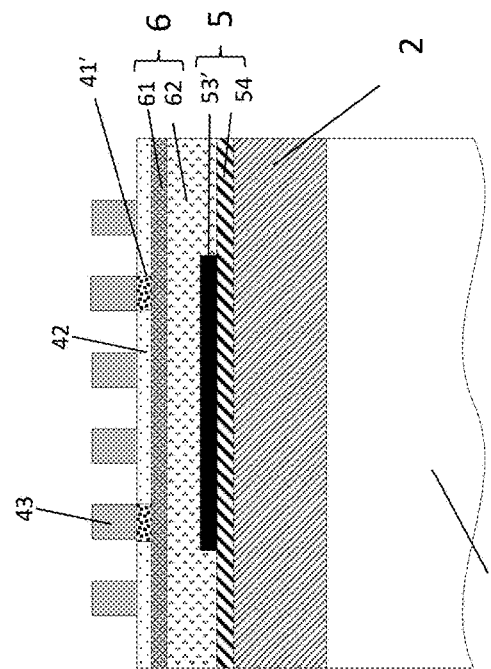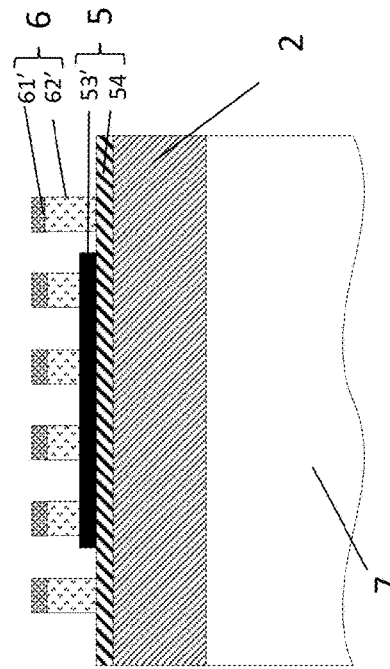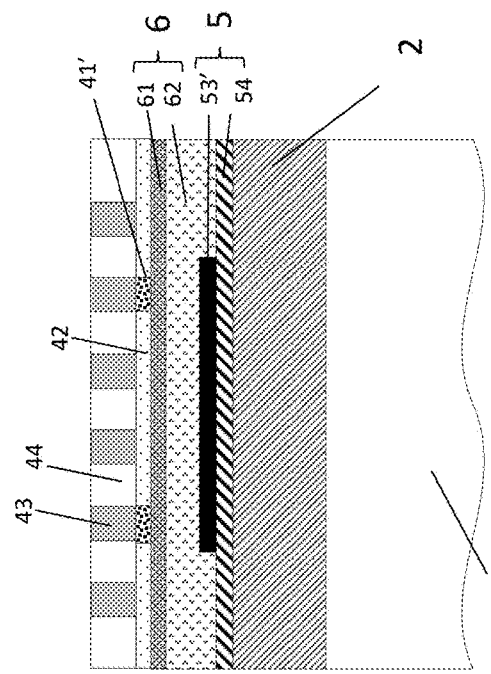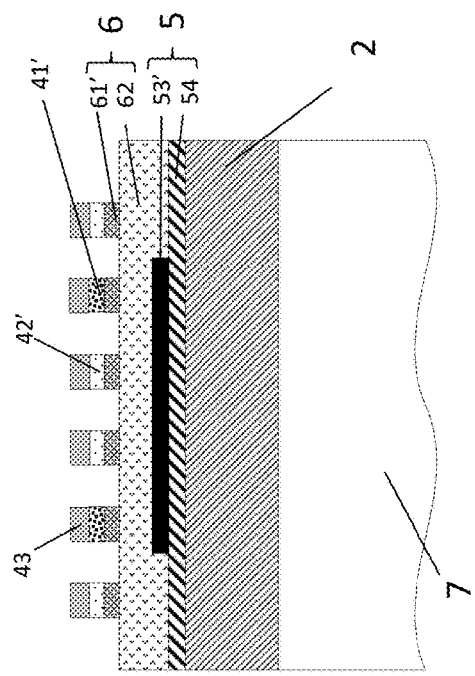

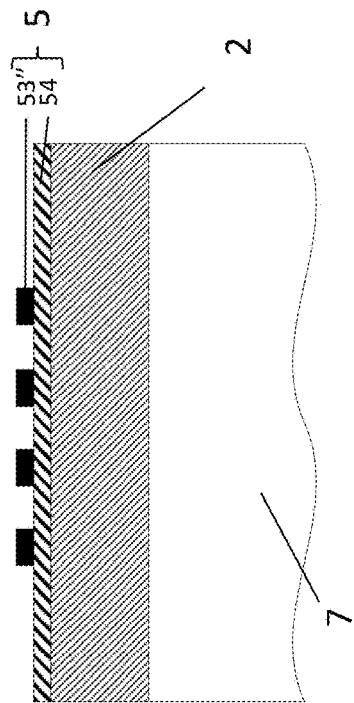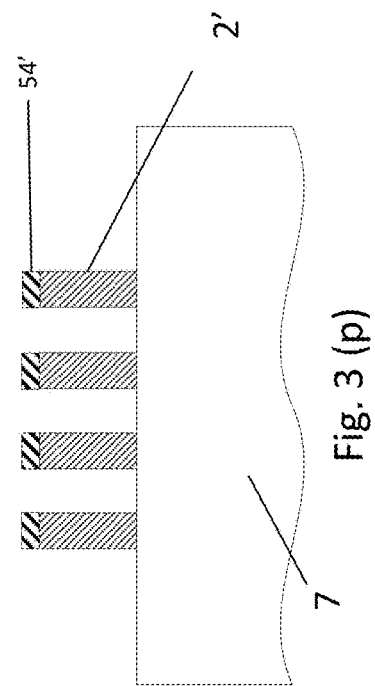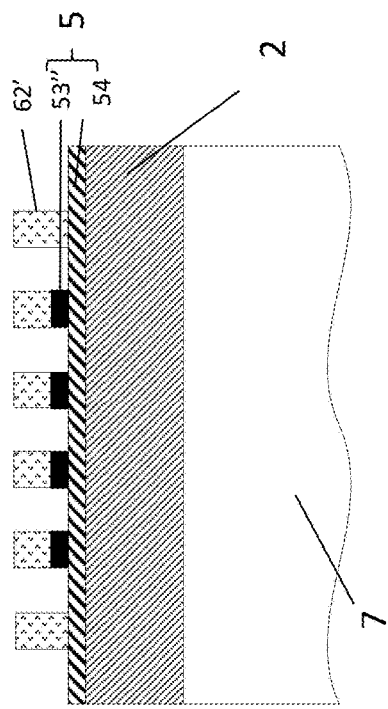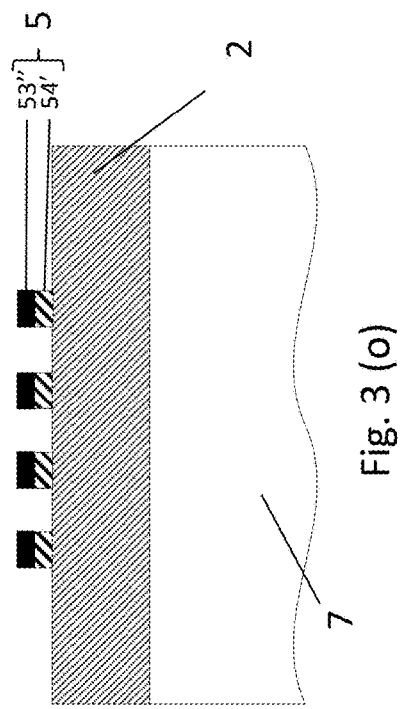

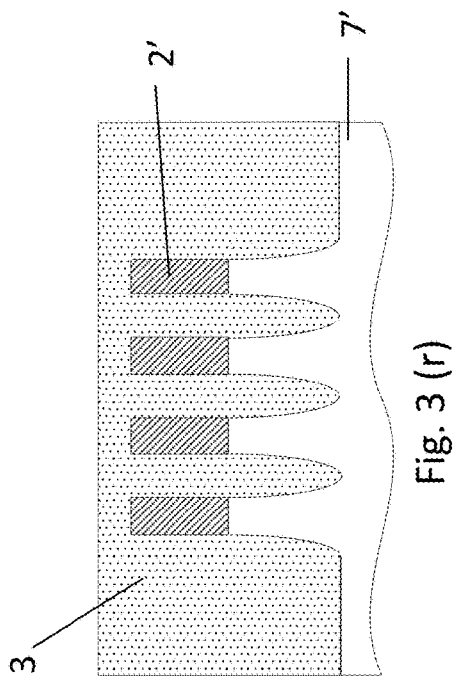
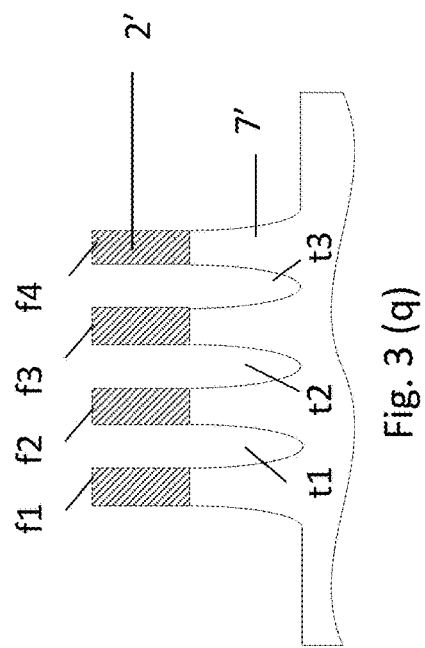
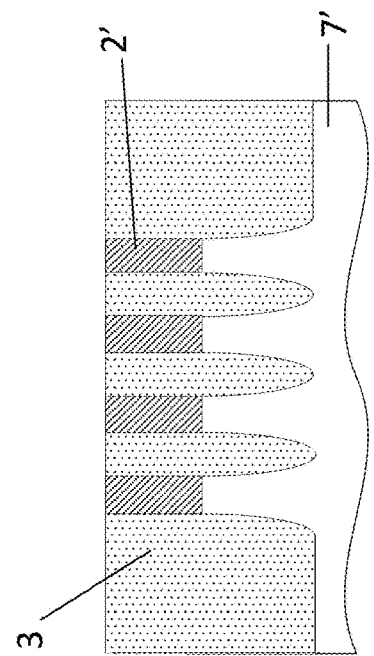

METHOD FOR PRODUCING FIN STRUCTURES OF A SEMICONDUCTOR DEVICE IN A SUBSTRATE

CROSS-REFERENCE TO RELATED APPLICATIONS

This application is a divisional of U.S. patent application Ser. No. 14/628,608 filed on Feb. 23, 2015, which claims priority to European Patent Application No. 14156358.5 filed on Feb. 24, 2014, the contents of which are hereby incorporated by reference.

TECHNICAL FIELD

The present disclosure relates to the field of semiconductor processing. More specifically, it relates to a method for producing fin structures of a semiconductor device in a substrate.

BACKGROUND ART

Different techniques are used for defining fin structures of semiconductor device, as for instance semiconductor devices of the finfet type. The dimensions and pitch of the fin structures (also called channels) of the finfet devices and pitches are following the ITRS roadmap and are getting smaller and smaller. Presently, a fin pitch of 10 nm (technology Node 10) can be achieved by advanced semiconductor processing techniques.

One of these techniques is known as the self-aligned double patterning (SADP) technique. This technique comprises the formation of dummy core structures, the sidewalls of which are foreseen by a spacer material, thereby resulting in narrow spacer structures surrounding the dummy core structures. The dummy core structures are then removed and the spacer structures are then disconnected by removing its end portions and patterned by means of a lithography step (a so-called "CUT lithography step"). The remaining very fine patterned spacer structures are then used as a mask for etching an underlying substrate to thereby define fin structures in the substrate for a finfet device, separated by narrow trenches.

The skilled person will appreciate that for still finer pitches, associated with fin pitches smaller than 10 nm, for instance 7 nm (technology Node 7, N7), the SADP technique seems to have reached its limits unless EUV lithography is used for defining the fin structures.

The EUV lithography technique has been considered a possible solution, but its insertion timing for high volume manufacturing is still an uncertainty due to source power and EUV mask infrastructure limitations. Therefore, use of SADP for technology nodes smaller than N10 is may not be advantageous.

Alternatively, another technique called Directed Self Assembly (DSA) can be used for the formation of fin structures smaller than those possible with the conventional lithography technique.

DSA is indicated as a potential method for CMOS integrated circuit patterning beyond the 10 nm node. The skilled person will appreciate that the application of this technique in CMOS still suffers from various disadvantages, some of which will be described below.

Thus, there exists a need for alternative techniques for producing fin structures of semiconductor devices, especially devices having fin pitch smaller than 10 nm (technology Node 10, N10).

SUMMARY OF THE DISCLOSURE

It is an aim of the present disclosure to provide a method for producing fin structures, using DSA lithographic patterning, in an area of a semiconductor substrate, which helps to solve one or more of the problems present in the state of the art.

It is a further aim to provide semiconductor structures associated to the above method.

This aim may be achieved according to the disclosure with the method and semiconductor structures showing the technical characteristics of the independent claims.

In a first aspect of the present disclosure, a method is disclosed for producing fin structures, using DSA lithographic patterning, in an area of a semiconductor substrate is disclosed. In one embodiment, the method includes providing a semiconductor substrate covered with a shallow trench isolation layer stack on a side thereof, for instance on a main surface thereof; defining a fin area on that side of the substrate, wherein the fin structures will be produced, by performing a lithographic patterning step other than DSA; and thereafter, producing the fin structures in the semiconductor substrate within the fin area according to a predetermined fin pattern using DSA lithographic patterning.

The semiconductor substrate can for instance be a silicon substrate, SOI and III/V and any group IV substrate (for instance a Germanium substrate).

Generally, DSA lithographic patterning is a lithography technique in which a mask layer is produced by means of a directed self-assembly process. In one example, DSA lithographic patterning can be carried out by using a DSA layer stack. A DSA layer stack comprises or consists of a pre-mask pattern (for instance cross-linked polystyrene (X-PS) pattern, for instance stripe structures), a planarizing neutral brush layer (NUL), and a self-organizing block co-polymer (BCP) layer (for instance a di-block co-polymer of PS-b-PMMA). The pre-mask layer (e.g., X-PS layer) is deposited over the surface and patterned by using a photoresist and an associated lithography step. The photoresist layer is thereby patterned. The structures of the patterned photoresist layer are then trimmed. The trimmed photoresist structures are then used to pattern the pre-mask layer, leading to the pre-mask pattern. Spin coating of the neutral layer fills the spaces in between the pre-mask pattern resulting in a planarized layer, which is followed by a baking and a rinsing step. Then the BCP layer is spin coated and annealed leading to the self-organization of the polymer constituents according to the pre-mask pattern, whereby for instance the PS component of the BCP aligns with the X-PS pre-mask pattern. After removal of one of the polymer constituents by selective etching, e.g. the PMMA component, the pattern is ready to be transferred into the underlying layer(s).

A shallow trench isolation layer can for instance comprise silicon nitride, silicon nitride and pad oxide, and/or $SiO_2$.

A lithographic patterning step other than DSA can for instance comprise 193 nm or 193 nm immersion, EUV single patterning, SADP (self-aligned triple patterning), SAQP (self-aligned quadruple patterning), SATP (self-aligned triple patterning), and the like.

It will be appreciated that defining a fin area can be direct or indirect. The direct definition corresponds to embodiments of a first type, and includes etching into the semiconductor substrate, at a stage before actually etching the fin structures. An indirect definition of the fin area, embodied by embodiments of a second type, includes defining the fin area in a hard mask layer overlying the semiconductor substrate.

According to embodiments of the first type, defining a fin area may include providing a patterned photo resist layer on the shallow trench isolation layer stack; and plasma etching into the STI layer stack and into the substrate to thereby physically define the fin area in the semiconductor substrate by lateral sidewalls protruding from the semiconductor substrate, the fin area being positioned below the patterned photo resist layer.

According to example embodiments, providing a patterned photo resist layer may include providing a photo resist layer on the shallow trench isolation layer stack; and patterning the photo resist layer.

According to example embodiments, the method may include selectively removing the patterned photo resist layer from the STI layer stack; providing a filling layer embedding at least the lateral sidewalls; and performing a surface flattening step on the filling layer in order to remove excess material of the filling layer, thereby exposing the STI layer stack and arriving at a flattened surface. The method may also include providing a hard mask layer on the flattened surface; providing a DSA layer stack on the hard mask layer; patterning the DSA layer stack into a stripe pattern; etching the hard mask layer, STI layer stack and substrate in between stripes of the stripe pattern, thereby defining the fin structures, the fin structures being separated by trenches; filling the trenches with a second filling layer; and performing a surface flattening step on the second filling layer in order to remove excess material of the second filling layer, thereby exposing the STI layer stack and arriving at a flattened surface.

According to example embodiments, patterning the photo resist layer further comprises patterning the photo resist layer corresponding to an alignment feature, and wherein plasma etching into the substrate comprises producing alignment features in the substrate.

According to example embodiments of a second type, the method may include providing a DSA layer stack on the planarizing filling layer, and patterning it into a striped pattern; patterning the planarizing filling layer and the hard mask layer into a striped pattern using DSA lithographic patterning; and etching the STI layer stack and substrate in between stripes of the striped pattern of the patterned hard mask layer thereby defining the fin structures, the fin structures being separated by trenches. The method may also include filling the trenches with a second filling layer; and performing a surface flattening step on the second filling layer in order to remove excess material of the second filling layer, thereby exposing the STI layer stack and arriving at a flattened surface.

According to example embodiments, providing the patterned hard mask layer further comprises patterning the hard mask layer according to a pattern corresponding to an alignment feature.

According to example embodiments, the hard mask layer comprises different sub-layers, and patterning the latter comprises only removing one or more sub-layers, without removing the lowest layer of the sub-layers.

According to example embodiments, the hard mask layer comprises a layer stack of a SiOC sublayer on top of an APF (Advanced Patterning film) sublayer on top of a silicon nitride (e.g. $Si_3N_4$) sublayer on top of a SiO2 sublayer, and patterning the hard mask layer comprises removing only the SiOC sublayer and the APF sublayer in the fin area, while removing also the silicon nitride layer outside the fin area. In the fin area, the silicon nitride sublayer and SiO2 sublayer are then remaining. Outside the fin area, only the SiO2 sublayer is then remaining.

According to example embodiments the hard mask layer comprises a layer stack of a SiOC sublayer on top of an APF sublayer on top of an silicon nitride sublayer on top of a $SiO_2$ sublayer, and patterning the hard mask layer comprises removing the SiOC sublayer and the APF sublayer outside the fin area; and thereafter removing the SiOC sublayer in the fin area, and removing the silicon nitride sublayer outside the fin area; and thereafter removing the APF sublayer in the fin area.

The methods according to embodiments of the first and second type may be performed for producing a set of fin structures with a pitch smaller than 10 nm.

In a second aspect of the present disclosure, a semiconductor structure is disclosed and may include a semiconductor substrate comprising a shallow trench isolation layer stack on a side thereof; and a fin area in the semiconductor substrate, the fin area protruding from the semiconductor substrate, comprising a portion of the shallow trench isolation layer stack and comprising lateral sidewalls. The semiconductor structure may also include a filling layer embedding at least the lateral sidewalls of the fin area, the filling area and the fin area abutting on a common planar surface, for instance a front surface; and a patterned hard mask layer on top of the common planar surface, extending at least in the fin area and comprising a striped pattern.

According to example embodiments, the semiconductor structure further comprises trenches in the fin area, thereby defining fin structures in the semiconductor substrate, the trenches corresponding to the striped pattern.

In a third aspect of the present disclosure, a semiconductor structure is disclosed and may include a semiconductor substrate comprising a shallow trench isolation layer stack on a side thereof; a patterned hard mask layer on and protruding from the shallow trench isolation layer stack, corresponding to a fin area; and a filling layer abutting a planar front surface and embedding the patterned mask layer, the filling layer further being patterned according to a striped pattern in the fin area.

According to example embodiments, patterned hard mask layer comprises a layer stack of a silicon nitride sublayer on top of a $SiO_2$ sublayer in the fin area, and comprises only a $SiO_2$ sublayer outside the fin area.

Features and advantages disclosed for one of the above aspects of the present invention are hereby also implicitly disclosed for the other aspects, mutatis mutandis, as the skilled person will recognize.

BRIEF DESCRIPTION OF THE DRAWINGS

The disclosure will be further elucidated by means of the following description and the appended figures.

FIGS. 1(a) to 1(j) illustrate a process flow according to a method of the first aspect of the present disclosure, of the first type.

Similar features are indicated by similar reference numbers. Reference number N used for layer N can be indicated as "N'", "N''" and "N'''", and the like, depending on different states of the layer N during the illustrated process flow. For example, a layer N which is patterned can be indicated by N'; a layer N' which is patterned can be indicated N''', and the like.

DETAILED DESCRIPTION OF EMBODIMENTS OF THE PRESENT DISCLOSURE

For fin pitches smaller than 10 nm, where DSA can be used for the formation of fin structures, cut lithography poses different challenges. Performing the cut-lithography step after a DSA patterning step could be a problem since the alignment as zero mark after DSA formation may be difficult. Alignment is important especially for technology nodes smaller than N10. Besides, a cut lithography following DSA could lead to an increase in line edge roughness (LER)/line width roughness (LWR) of the patterned fins, which jeopardizes the advantage of having low LWR/LER values offered by the DSA technique.

Figure 1A:
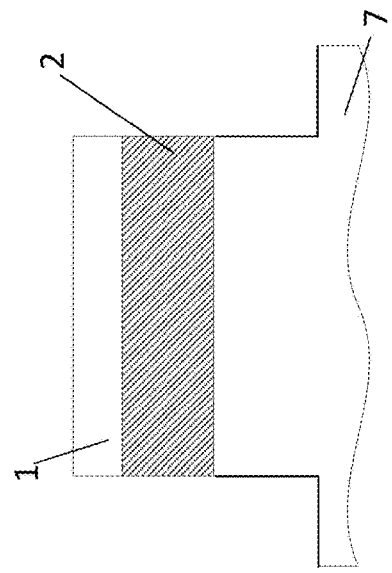
Figure 1B:
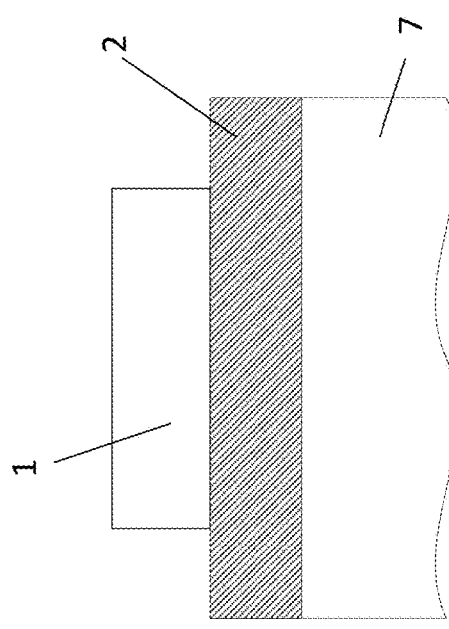

According to example embodiments of a first type, illustrated in FIGS. 1(a) and 1(b), defining a fin area includes providing a patterned photo resist layer (1) on a shallow trench isolation layer stack (2), and plasma etching into the STI layer stack (2) and into a substrate (7) to thereby physically define the fin area in the semiconductor substrate by lateral sidewalls protruding from the semiconductor substrate. In this example, the fin area is positioned below the patterned photo resist layer (1).

The photo resist layer (1) can be for instance NTD (negative tone development) resist (M19) for X-PS guiding stripe patterning, and can be provided for instance by PTD (positive tone development) resist (5484) and 85 nm BARC (bottom anti-reflective coating) to keep the cut structure.

According to example embodiments, providing a patterned photo resist layer includes providing a photo resist layer on the shallow trench isolation layer stack, and patterning the photo resist layer.

Figure 1C:
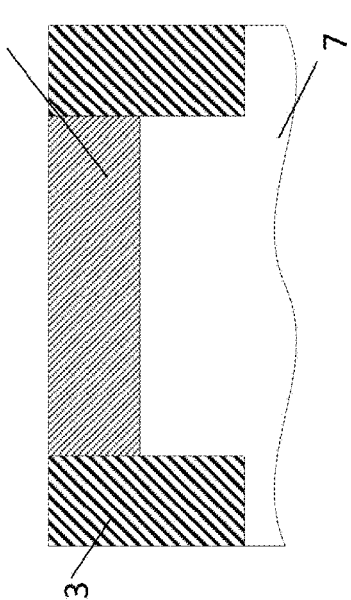
Figure 1D:
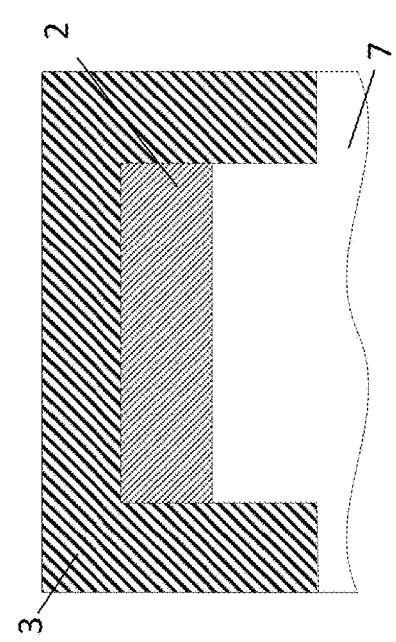

According to example embodiments, the method further includes selectively removing the patterned photo resist layer (1) from the STI layer stack (2) and providing a filling layer (3) embedding at least the lateral sidewalls, as shown in FIG. 1(c). This example method also includes performing a surface flattening step, for instance a CMP (Chemical Mechanical Polishing) step on the filling layer (3) in order to remove excess material of the filling layer, thereby exposing the STI layer stack (2) and arriving at a flattened surface, as shown in FIG. 1(d).

Figures 1E, 1F, 1G, 1H:
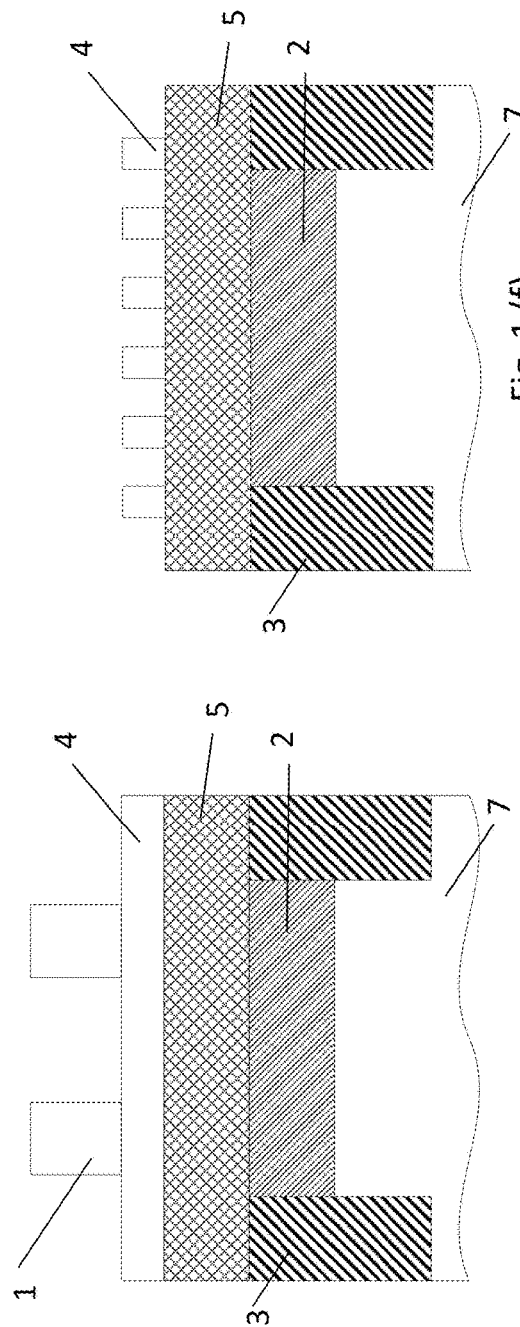

The method can for instance further comprise providing a hard mask layer (5) on the flattened surface, and providing a DSA layer stack (4) on the hard mask layer, as shown in FIG. 1(e). The method may also include patterning the DSA layer stack into a striped pattern, as shown in FIG. 1(f) (and for instance as will be explained in more detail in relation with FIG. 3(f) to (j)). Referring to FIGS. 1(g) and 1(h), the method may also include etching the hard mask layer (5), the STI layer stack (2), and the substrate (7), in one or more etching steps, for instance each based on different etching chemistries, between the stripes of the striped pattern, and thereby defining the fin structures (f1, f2, f3, f4). As seen in FIG. 1(h), the fin structures are separated by trenches (t1, t2, t3, t4, t5). In FIG. 1(i), the method includes filling the trenches with a second filling layer (6), such as after having removed the remaining portions of the hard mask, e.g. the remaining striped pattern of the hard mask. In FIG. 1(j), the method includes performing a surface flattening step on the second filling layer (6), for instance by means of CMP, in order to remove excess material of the second filling layer, thereby exposing the STI layer stack and arriving at a flattened surface.

Providing a hard mask layer on the flattened surface may comprise providing a hard mask layer stack. The hard mask layer can thus comprise sub-layers. The hard mask layer stack can be a stack comprising a layered structure of silicon nitride/a-Si/SiOC/APF. Alternatively, the stack can be a layered structure as SoC/SoG or AlN/SiON or SiON/APF or SiO$_2$/APF or SiOC/APF.

Etching the hard mask layer may itself comprise one or more etching steps, which are for instance based on different etching chemistries.

In the case of a chemo-epitaxy DSA process, a DSA layer stack can comprise for instance block-copolymer (for instance PS-b-PMMA) materials and neutral brush layer (for instance Hydroxyl-terminated poly(styrene-random-methyl methacrylate), P(S-r-MMA)-OH), and guided strip with X-PS (cross-linked polystyrene).

A striped pattern is a pattern comprising a plurality of stripes, for instance 3, 4, 5, or 6 stripes. BCP self-assemble multiplication can be used to generate the striped pattern. In one example, the BCP (polystyrene) component forms stripes that have dimensions and have a pitch which corresponds to predetermined fin dimensions. For instance, the stripes are substantially parallel or are parallel. In one example, BCP self-assembling lamellae are used for line/space application.

The filling layer and second filling layer can both or each comprise or consist of a dielectric material. In one example, the filling layers comprise SiO$_2$ as for instance thermal oxide or a CVD or PECVD oxide, low temperature oxide or spin-on glass.

According to example embodiments, patterning the photo resist layer further comprises patterning the photo resist layer corresponding to an alignment feature, and wherein plasma etching into the substrate comprises producing alignment features in the substrate.

Patterns for different lithography steps should be aligned to one another. Usually alignment features are included in the first pattern that is transferred to the substrate. These alignment features are used as references to help to position the subsequent patterns to the first pattern. The shape of an alignment feature may for instance comprise a cross-shaped feature when looked upon from above, and serves to align subsequent semiconductor processing steps with one another.

Example embodiments of a second type are illustrated for instance by means of FIGS. 2(a) to 2(m), and FIGS. 3(a) to 3(s).

According to an example embodiments of a second type, illustrated for instance in FIGS. 2(a) to 2(d), defining the fin area includes providing a patterned hard mask layer (5) on the shallow trench isolation layer stack, a pattern of the patterned hard mask layer corresponding to the fin area; and embedding the hard mask layer in a planarizing filling layer (6).

The hard mask layer (5) can for example comprise (for instance in the form of a layered structure of) SiO$_2$/APF (advance pattern film, for instance an amorphous carbon layer), SiOC/APF, SiON (CVD)/APF, SiON (PVD)/AlN, SoG/SoC, and the like. In one example, the hard mask layer comprises silicon nitride/a-Si/APF in a layered structure.

Patterning the hard mask layer may comprise using a photoresist/BARC (1).

According to embodiments of the present disclosure, patterning the hard mask layer may comprise fully or partially removing the hard mask. For instance, the thickness of the hard mask layer may be reduced to zero, in a first area of the hard mask such that the underlying STI stack becomes exposed in that area. The thickness of the hard mask may also only be reduced in an (possibly additional) area of the hard mask such that vertical side walls in the hard mask layer define the fin area. In case the hard mask comprises different sub-layers, the latter can be achieved by only removing one or more sub-layers, without removing the lowest layer of the sub-layer.

The planarizing filling layer (6) can be for instance SoG and/or SoC (spin-on-glass and/or spin-on-carbon) or photoresist/BARC (bottom anti-reflective coating).

In one example, the step of embedding the patterned hard mask layer comprises fully covering the hard mask layer by the planarizing filling layer.

Figure 2:
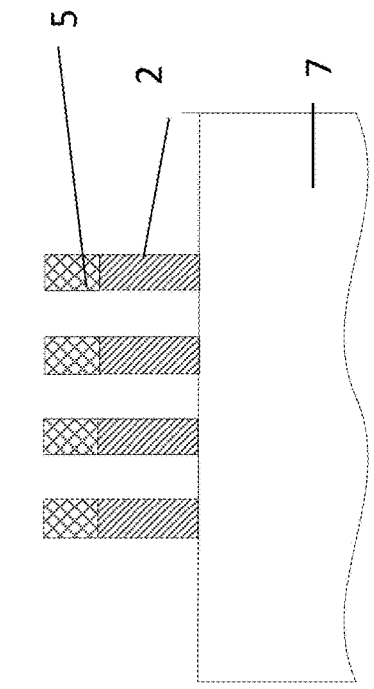
FIGS. 2(a) to 2(m) illustrate a process flow according to a method of the first aspect of the present disclosure, of the second type.
Figure 2:
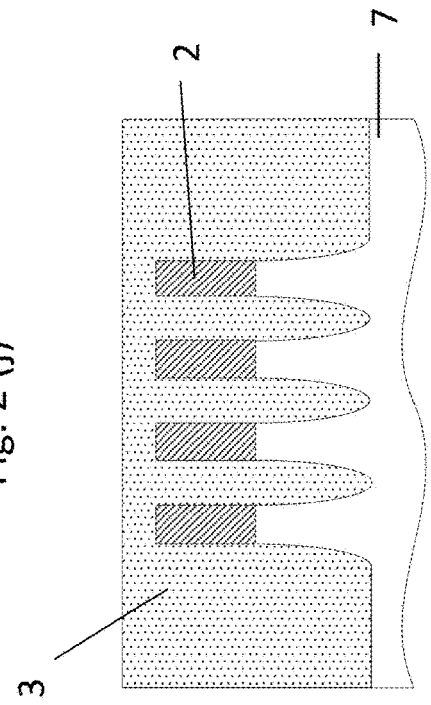
Figure 2:
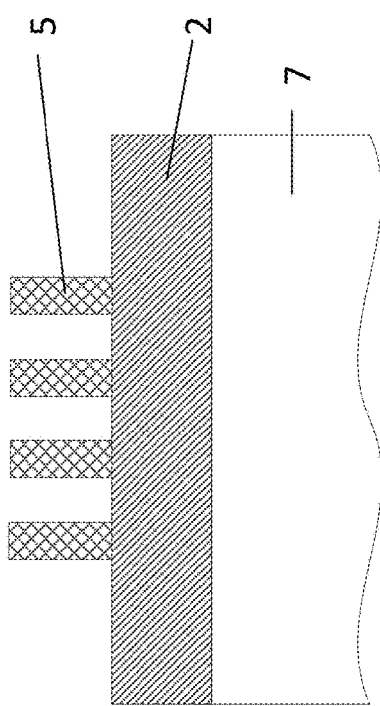
Figure 2:
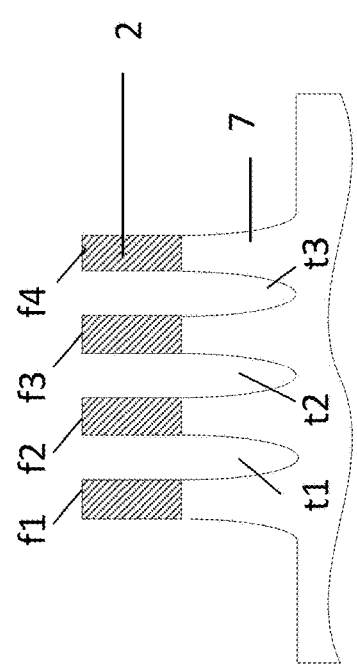
Figure 2:
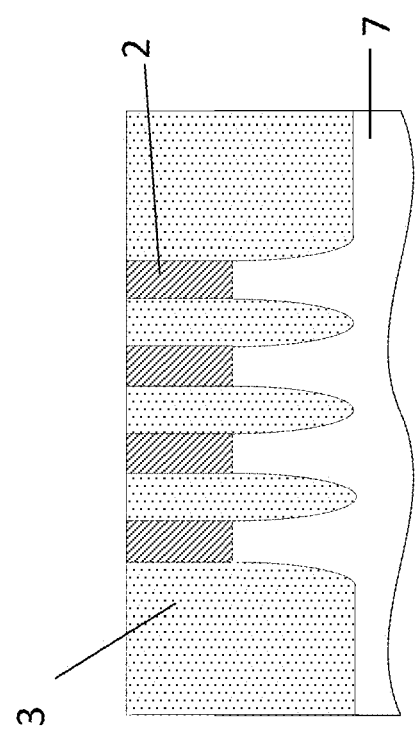

According to example embodiments, the method further comprises providing a DSA layer stack (4) on the planarizing filling layer, and patterning the DSA layer stack into a striped pattern, as shown in FIG. 2(*f*) (and for instance as will be explained in more detail in relation with FIG. 3(*f*) to (*j*)). This example method also includes patterning the planarizing filling layer (6) (as shown in FIG. 2(*g*)) and the hard mask layer (5) (as shown in FIG. 2(*h*)) into a striped pattern using DSA lithographic patterning (for instance etching selectively through the planarizing filling layer and stopping on the hard mask, followed by selectively etching through the hard mask (as shown in FIG. 2(*i*)) and stopping on the STI layer stack (2). Thereby the step of etching through the hard mask may comprise different subsequent selective etching steps, adapted to the respective sub-layers. Referring to FIGS. 2(*j*) and 2(*k*), the method includes etching the STI layer stack (2) (FIG. 2(*j*)) and substrate (7) (FIG. 2(*k*)) in between the stripes of the striped pattern of the patterned hard mask layer (5), thereby defining the fin structures, the fin structures being separated by trenches. Referring to FIG. 2(*l*), the method includes filling the trenches with a second filling layer (3), such as after having removed the remaining portion of the hard mask, e.g. the remaining striped pattern of the hard mask. The method may also include performing a surface flattening step (e.g. a CMP step) on the second filling layer in order to remove excess material of the second filling layer, thereby exposing the STI layer stack and arriving at a flattened surface, as shown in FIG. 2(*m*).

The process of providing a DSA layer stack and patterning it may be similar to the process described for the embodiments of the first type.

The second filling layer can be for instance $SiO_2$.

According to example embodiments, providing the patterned hard mask layer further comprises patterning the hard mask layer according to a pattern corresponding to an alignment feature.

Figure 3:
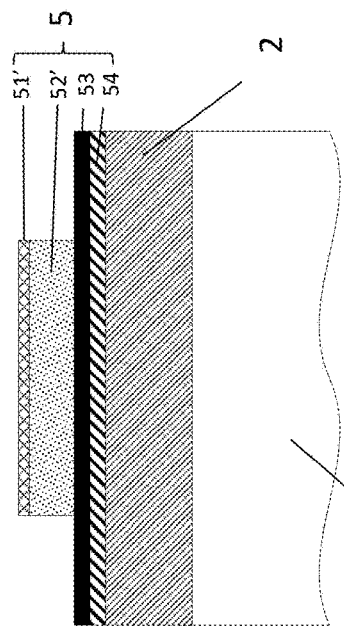
FIGS. 3(a) to 3(s) illustrate another process flow according to a method of the first aspect of the present disclosure, of the second type.
Figure 3:
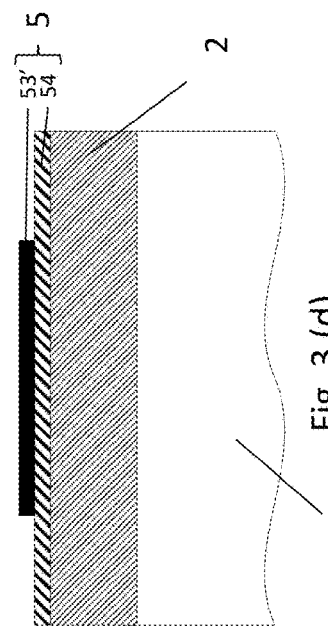
Figure 3:
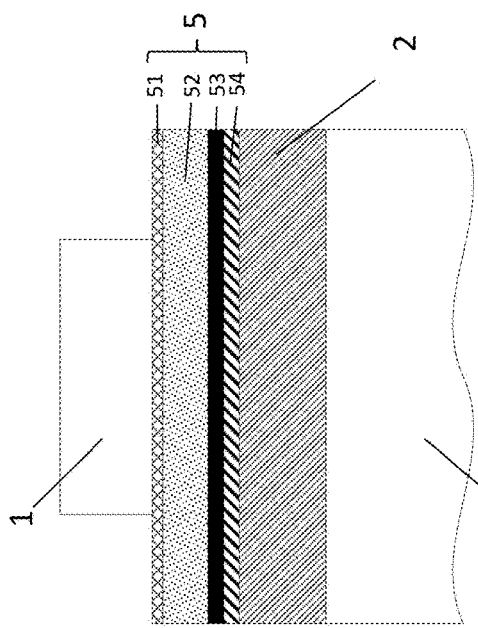
Figure 3:
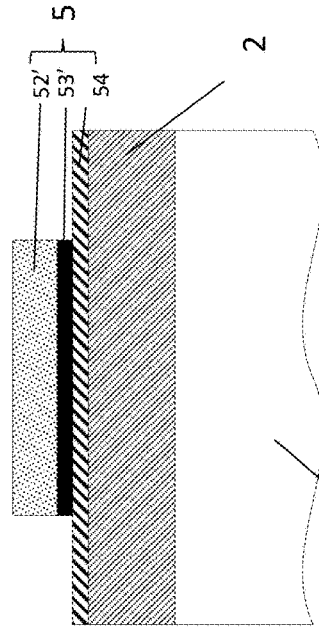
Figure 3:
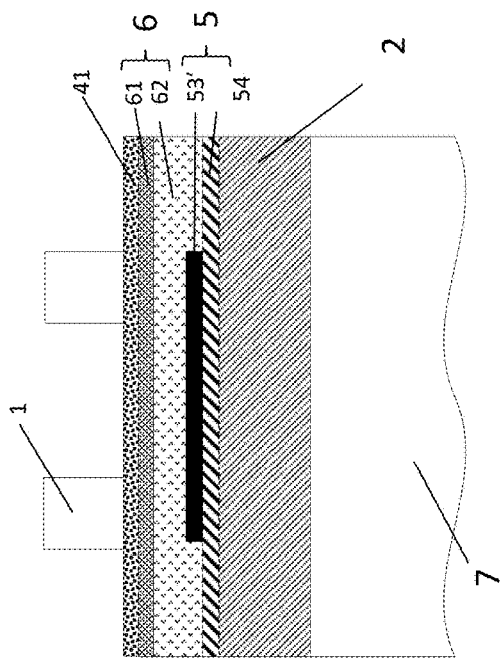
Figure 3:
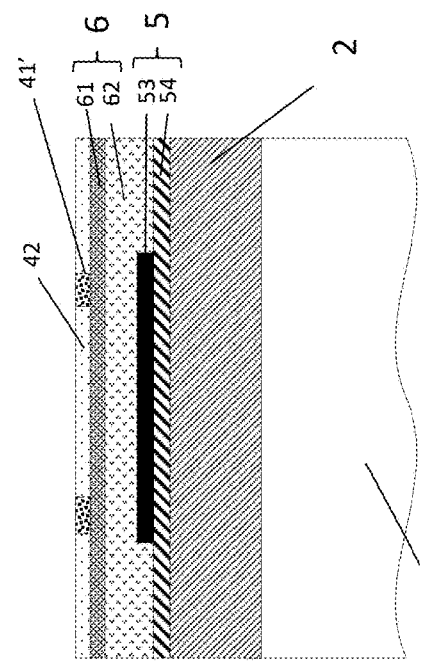
Figure 3:
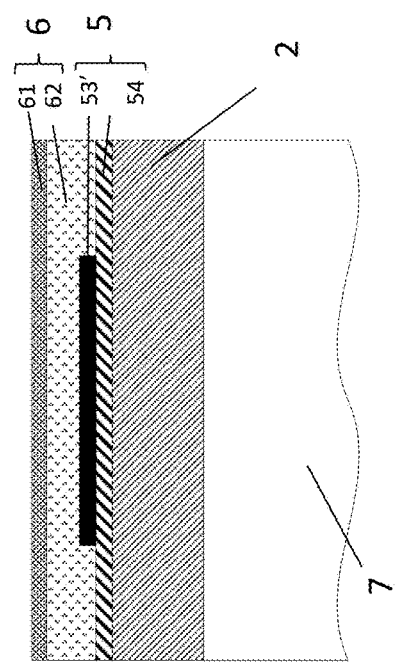
Figure 3:
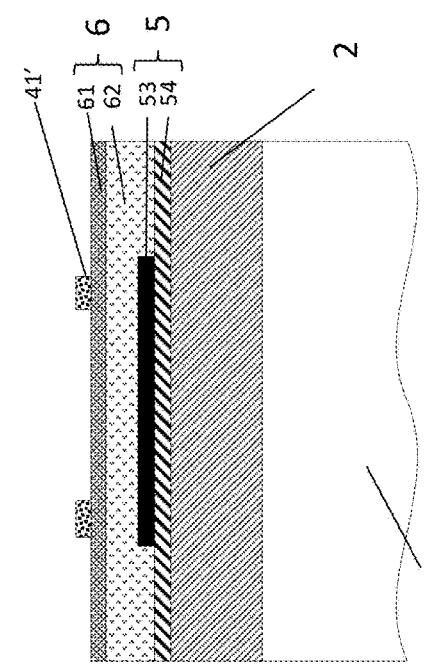

According to other example embodiments of a second type, illustrated for instance in FIG. 3(*a*), defining the fin area comprises providing a patterned hard mask layer (5) on the shallow trench isolation layer stack, a pattern of the patterned hard mask layer corresponding to the fin area; wherein the hard mask comprises different sub-layers.

In this example, the hard mask layer 5 comprises a layer stack, which is a layer stack of a SiOC sublayer 51 (15 nm) on top of an APF sublayer 52 (50 nm) on top of a silicon nitride (a $Si_3N_4$) (15 nm) sublayer 53 on top of a $SiO_2$ sublayer 54 (15 nm).

The hard mask layer may be patterned in different steps. First, for instance, a combined BARC and photoresist layer 1 is provided on top of the upper layer 51 of the hard mask 5. The photoresist layer is patterned in order to define an area corresponding to the fin area, as shown in FIG. 3(*a*). The BARC layer is selectively removed in the region outside the fin area. Then, the SiOC layer is selectively removed in the region outside the fin area, as shown in FIG. 3(*b*). Next, the APF layer 52 is selectively removed in the region outside the fin area. The combined photoresist and BARC layer 1 is removed in the fin area, as shown in FIG. 3(*b*). Next, the SiOC layer 51' is removed in the fin area, and the silicon nitride layer 53 is removed outside the fin area, as shown in FIG. 3(*c*).

Then, the silicon nitride layer is selectively removed in the region outside the fin area. Next, the APF layer 52' is selectively removed in the fin area. The result is a silicon nitride mesa structure 53' on top of the $SiO_2$ sublayer 54, forming the patterned hard mask layer 5, as shown in FIG. 3(*d*).

The etch process parameters (pressure, plasma power, bias voltage, chuck temperature, gas flow rates, etching time) that can for instance be used for the process steps above are provided in Table 1.

TABLE 1

| Range | BARC | SiOC | APF | SiN ME1 | SiN ME2 | SiN OE | Strip |
|---|---|---|---|---|---|---|---|
| Pressure (mT) | 3-15 | 3-20 | 3-20 | 15-50 | 3-20 | 15-50 | 3-20 |
| Power (W) | 300-500 | 450-800 | 300-700 | 300-700 | 200-500 | 300-700 | 600-1200 |
| Bias (V) | 50-300 | 50-300 | 50-300 | 200-500 | 50-300 | 150-500 | 25-30 |
| Temperature (° C.) | 25-50 | 35-65 | 25-50 | 25-50 | 35-65 | 35-65 | 35-65 |
| Gas flow 1 (sccm) | Cl2 (5-30) | He (40-120) | HBr (10-80) | C4F8 (5-30) | CF4 (40-120) | CH3F (100-300) | O2 (100-500) |
| Gas flow 2 (sccm) | He (40-120) | O2 (5-20) | O2 (10-80) | Ar (300-900) | Ar (25-250) | O2 (10-80) | — |
| Gas flow 3 (sccm) | O2 (5-20) | CF4 (40-120) | N2 (50-300) | — | — | — | — |
| Gas flow 4 (sccm) | — | CHF3 (30-70) | — | — | — | — | — |
| Times (s) | 25-60 | 25-60 | 40-90 | 10-40 | 20-40 | 30-60 | 30-60 |

The SiOC etch was based on a regular CF4 based process.

The APF etch step was an HBr/O2/N2 based process to optimize the straight APF profile and N2 is to improve the sidewall passivation during etch.

The first silicon nitride etch ME1 is C4F8 based to etch the remaining SiOC layer 51' on top of APF layer 52' faster than the silicon nitride underneath the APF film 52'. Thus the SiOC layer 51' is removed while having only a small recess into the silicon nitride 53.

The second silicon nitride etch ME2 is based on CF4 which is etching the remaining silicon nitride, but does not have a good selectivity toward $SiO_2$ underneath silicon nitride.

Thus, a third silicon nitride etch step, silicon nitride OE, is performed which is CH3F/O2 based and has a high selectivity towards $SiO_2$ and will help to ensure that all the silicon nitride layer is etched.

A planarizing filling layer 6 may be applied on the silicon nitride layer 53 and $SiO_2$ layer 54, and may comprise a SoC (spin-on-carbon) layer 62 (40 nm thick) and a SoG (spin-on-glass) layer 61 (15 nm thick), as shown in FIG. 3(*e*), fully covering the hard mask layer. Referring to FIG. 3(*f*), a cross-linked polystyrene (X-PS) layer 41 may be provided on the planarizing filling layer 6 (thickness X-PS about 7 nm). The X-PS layer may be subsequently patterned into guiding stripe patterns 41'. A combined photoresist/BARC (bottom anti-reflective coating) layer 1 is may also be applied on the X-PS layer 41 and patterned to form a photoresist/BARC structures 1, as shown in FIG. 3(*f*). The photoresist/BARC structures 1 are trimmed (reduced in size) and transferred into the X-PS layer 41, as shown in FIG. 3(*g*). The latter processes can occur in a single step, but can be applied in two independent steps. It has been shown that performing two independent steps is advantageous, as for instance it allows manufacturing nearly vertical profiles with minimal footage, there is no damage to the X-PS, the PR can easily be stripped, the use of an gas easy to handle, and the smaller X-PS critical dimensions (CD) may be achieved. The two etch steps can for instance be performed with the parameters illustrated in Table 2.

TABLE 2

| Range | PR trim | XPS etch |
|---|---|---|
| Pressure (mT) | 500-800 | 5-20 |
| Power (W) | 250-500 | 50-250 |
| Bias (W) | 50-100 | 20-120 |
| Temperature (° C.) | 10-40 | 10-40 |
| Gas flow 1 (sccm) | O2 (700-1200) | O2 (100-300) |
| Gas flow 2 (sccm) | N2 (20-70) | N2 (20-70) |
| Gas flow 3 (sccm) | — | — |

TABLE 2-continued

| Range | PR trim | XPS etch |
|---|---|---|
| Gas flow 4 (sccm) | — | — |
| Times (s) | 2-10 | 2-10 |

The first etch is used to trim the PR which can be done with an isotropic etch. This is performed at high pressure and at a high amount of O2/N2.

The second etch is an etch into the X-PS layer with low pressure and low gas flow. An anisitropic etch is performed to cut the X-PS footing which may be present at the bases of the X-PS structures 41' after patterning the X-PS layer 41.

Referring to FIG. 3(*h*), a neutral layer (NUL) 42 is now applied and embeds the X-PS guiding stripes 41'. For instance, a brush layer can be applied, embedding the guiding stripes 41'. The lower portion of the brush layer is grafted and the non-grafted portion, which is in excess, is removed, for instance by rinsing. The NUL layer 42 and grafting process may be predetermined such that the height of the grafted portion is substantially equal to the height of the guiding structures 41', as shown in FIG. 3(*h*).

A BCP (Block copolymer; PS-PMMA: polystryrene-poly methyl methacrylate) layer is provided on the X-PS 41'/NUL 42 layer (guiding layer). A suitable anneal step is applied in order to allow phase separation of the BCP layer in a periodic line pattern formed by alternating line structures of a first component 43 and a second component 44, based on DSA (directed self assembly). This results in an alternating striped pattern of PMMA 44 and PS 43, as shown in FIG. 3(*i*). The PMMA component 44 may then be removed selectively with respect to the PS component 43, as shown in FIG. 3(*j*).

The PS-pattern 43 is now transferred into the underlying NUL layer 42 (forming the guiding layer together with the X-PS 41' guiding structures), forming NUL layer structures 42'. Thereby, footing of the X-PS structures 41' can be etched/removed.

Referring to FIG. 3(*k*), the PS-pattern 43 is transferred into the SoG layer 61, resulting in a patterned SoG layer 61'.

The remaining PS-pattern 43 is removed, as well as the X-PS 41'/NUL 42' layer. The remaining SoG pattern 61' is then transferred into the SoC layer 62, stopping at the silicon nitride layer 53' within the fin area, and at the SiO$_2$ layer 54, as shown in FIG. 3(*l*), outside the fin area.

An overview of process parameters that can be used for the etch process steps above is provided in Table 3.

TABLE 3

| Range | PMMA | NUL | SiN | SoG | SoC |
|---|---|---|---|---|---|
| Pressure (mT) | 10-40 | 3-20 | 3-20 | 10-40 | 10-40 |
| Power (W) | 100-250 | 100-300 | 100-250 | 300-550 | 300-550 |
| Bias (W) | 20-50 | 20-120 | 20-50 | 20-120 | 50-200 |
| Temperature (° C.) | 0-40 | 0-40 | 20-40 | 20-40 | 20-40 |
| Gas flow 1 (sccm) | O2 (10-120) | H2 (50-200) | CHF3 (50-120) | CHF3 (10-40) | H2 (100-400) |
| Gas flow 2 (sccm) | Ar (600-900) | Ar (50-200) | CF4 (150-250) | CF4 (50-100) | N2 (100-400) |
| Gas flow 3 (sccm) | — | CH4 (2-10) | O2 (2-10) | — | — |
| Gas flow 4 (sccm) | — | — | — | 0 | — |
| Times (s) | 10-20 | 5-20 | 20-60 | 5-20 | 30-80 |

The PMMA etch is O2 based, wherein PMMA is etched selectively to PS. Typically a selectivity of 7 is reached.

The NUL etch is for etching into a neutral layer and some of the XPS footing which is created during the XPS patterning prior to the BCP assembly.

The silicon nitride etch is CF4/CHF3 based, an etch chemistry which is selective to PS.

The SoG etch is CF4/CHF3 based.

The SoC etch is H2/H3 based.

The SoG pattern 61' is selectively removed. Then also the SoC pattern 62' is transferred into the silicon nitride layer 53 as shown in FIG. 3(*m*), and is then selectively removed, as shown in FIG. 3(*n*). A silicon nitride pattern 53" is now created present only in the fin area.

The silicon nitride pattern 53" is then transferred into the SiO$_2$ layer 54, as shown in FIG. 3(*o*). The silicon nitride layer 53' is subsequently removed selectively, leaving a SiO$_2$ pattern 54', which is then transferred into the STI layer stack 2 (e.g. a 30 nm silicon nitride/3 nm pad SiO$_2$), as shown in FIG. 3(*p*). The lower hard mask layer 54', the SiO$_2$ layer, may be selectively removed. The patterned STI layer stack 2' is then further transferred into the underlying silicon substrate 7, as shown in FIG. 3(q). Fin structures f1, f2, f3, f4 are formed, being separated by trenches in the substrate t1, t2, t3.

The trenches are filled with a second filling layer 3, as shown in FIG. 3(r). A surface flattening step is performed (e.g. a CMP step) on the second filling layer 3 (e.g. $SiO_2$) in order to remove excess material of the second filling layer, thereby exposing the STI layer stack and arriving at a flattened surface, as shown in FIG. 3(s).

It is a potential advantage of the process illustrated in relation with FIGS. 3(a) to 3(s) that the hard mask etched profile SiOC/APF can be better controlled such that for instance a less tapered pattern can be achieved.

It will be appreciated that performing a method for producing a set of fin structures with a pitch smaller than 10 nm with embodiments according to the present disclosure is beneficial when compared to state of the art methods.

The invention claimed is:

1. A structure comprising
a semiconductor substrate comprising a shallow trench isolation layer stack on a side thereof;
a patterned hard mask layer on and protruding from the shallow trench isolation layer stack, and corresponding to a fin area, wherein the patterned hard mask layer comprises a layer stack of a silicon nitride sublayer on top of a $SiO_2$ sublayer in the fin area, and comprises the $SiO_2$ sublayer without the silicon nitride sublayer outside the fin area; and
a filling layer abutting a planar front surface of and embedding the patterned hard mask layer, wherein the filling layer is further patterned according to a striped pattern in the fin area.

2. The structure of claim 1, wherein the filling layer comprises a layer stack of a spin-on-carbon sublayer and a spin-on-glass sublayer.

3. The structure of claim 2, wherein the spin-on-carbon layer is on top of the silicon nitride sublayer in at least the fin area, and the spin-on-glass sublayer is on top of the spin-on-carbon layer in at least the fin area.

4. The structure of claim 3, wherein the filling layer comprises polystyrene.

5. The structure of claim 4, wherein the filling layer comprises a layer stack of a cross-linked polystyrene, a neutral layer that embeds the cross-linked polystyrene, and a polystyrene-pattern.

6. The structure of claim 5, wherein the cross-linked polystyrene is on top of the spin-on-glass sublayer.

7. The structure of claim 1, wherein the filling layer comprises a spin-on-carbon sublayer on top of the silicon nitride sublayer.

8. The structure of claim 1, wherein the shallow trench isolation layer stack is a continuous layer covering the side of the semiconductor substrate.

9. The structure of claim 8, wherein the patterned hard mask layer is directly on and protrudes from the continuous shallow trench isolation layer stack.

10. The structure of claim 9, wherein the filling layer is patterned according to a striped pattern comprising a plurality of stripes disposed over the continuous shallow trench isolation layer stack in the fin area.

* * * * *